United States Patent
Kanzaki et al.

(10) Patent No.: US 6,417,459 B1
(45) Date of Patent: Jul. 9, 2002

(54) PRINTED CIRCUIT BOARD, AND PREPREG FOR A PRINTED CIRCUIT BOARD

(75) Inventors: Hitoshi Kanzaki; Yasuhiko Ichino; Toshimitsu Tanii; Kouji Ohnishi, all of Sanda (JP)

(73) Assignee: Nippon Pillar Packing Co., Ltd., Osaka (JP)

( * ) Notice: Subject to any disclaimer, the term of this patent is extended or adjusted under 35 U.S.C. 154(b) by 0 days.

(21) Appl. No.: 09/744,997

(22) PCT Filed: Jul. 5, 1999

(86) PCT No.: PCT/JP99/03610
§ 371 (c)(1),
(2), (4) Date: Feb. 21, 2001

(87) PCT Pub. No.: WO01/03478
PCT Pub. Date: Jan. 11, 2001

(51) Int. Cl.$^7$ .............................. H05K 1/00; B32B 5/02
(52) U.S. Cl. .................. 174/254; 174/250; 428/209; 428/901; 442/117; 442/175; 442/180
(58) Field of Search ................ 174/250, 254; 442/208, 117, 175, 180, 218, 232, 233, 234; 428/209, 901

(56) References Cited

U.S. PATENT DOCUMENTS

| | | | |
|---|---|---|---|
| 4,707,565 A | * 11/1987 | Kasai et al. | 174/68.5 |
| 5,100,722 A | * 3/1992 | Nakamura et al. | 428/263 |
| 5,837,624 A | * 11/1998 | Sakaguchi et al. | 442/208 |
| 6,261,675 B1 | * 7/2001 | Hsiao et al. | 428/219 |

FOREIGN PATENT DOCUMENTS

| | | |
|---|---|---|
| JP | 63-224936 | 9/1988 |
| JP | 2-187334 | 7/1990 |
| JP | 06-344501 | * 12/1994 |
| JP | 06-344502 | * 12/1994 |
| JP | 06-344503 | * 12/1994 |
| JP | 07-050318 | * 2/1995 |
| JP | 07-037938 | * 7/1995 |
| JP | 7-90626 | 10/1995 |
| JP | 07-323501 | * 12/1995 |
| JP | 8-18403 | 2/1996 |
| JP | 08-148780 | * 6/1996 |
| JP | 2614190 | 2/1997 |
| JP | 9-111577 | 4/1997 |
| JP | 2783359 | 5/1998 |
| JP | 2000-022291 | * 2/2000 |

* cited by examiner

*Primary Examiner*—David L. Talbott
*Assistant Examiner*—J B Patel
(74) *Attorney, Agent, or Firm*—Jones, Tullar & Cooper, P.C.

(57) ABSTRACT

A fluororesin-impregnated adhesive layer 7 such as PFA is formed on one face or both faces of a prepreg 1 in which a fluororesin-impregnated layer 3 such as PTFE is impregnated and held into E-glass cloth 2 that serves as a basic material of the prepreg. The prepreg has a (mass of 30 g/m$^2$ or less, and is woven by filament bundles each of which is configured by 120 or less glass filaments. Copper foil 5 is placed on the fluororesin-impregnated adhesive layer 7 to form a predetermined conductor pattern on the surface, thereby producing a printed circuit board having a thickness of 0.2 mm or less. Therefore, the printed circuit board is excellent in dielectric characteristics, electrical insulation resistance between through holes, and its long-term reliability, and superior also in flexibility. Consequently, the printed circuit board is applicable to any use such as a high-frequency circuit.

7 Claims, 4 Drawing Sheets

PRINTED CIRCUIT BOARD, AND PREPREG FOR A PRINTED CIRCUIT BOARD

TECHNICAL FIELD

The present invention relates to a printed circuit board, and prepreg for a printed circuit board, and more particularly to a printed circuit board, and prepreg for a printed circuit board that are to be applied to usage which is used in the high-frequency band, and in which long-term reliability of electrical insulation, dielectric characteristics, and flexibility are requested, for example, a high-frequency antenna such as a low-dielectric loss three-dimensional antenna, a millimeter wave radar antenna, a high-frequency electronic component such as a high-frequency filter or a VCO, a base substrate for a high-frequency semiconductor device, and an IC package.

BACKGROUND ART

Recently, in accordance with the arrival of an advanced information society, communication means is remarkably changed, and information transmission tends to be made higher in speed and frequency. Also a mobile communication device such as a portable telephone, an automobile telephone, or a pager, and a new media system such as satellite broadcasting or satellite communication are in a stage of practical use, and expected to be used more widely in the future. In a new era of satellite broadcasting and satellite communication, particularly, it is requested to develop a printed circuit board for a high-frequency circuit such as a BS converter or an antenna which can cope with frequency bands from the microwave (1 to 30 GHz) region to the millimeter wave (30 to 300 GHz) region that is suitable for information transmission at a higher speed.

In the field of information processing, the clock frequency is made higher in order to attain high-speed calculation, and fusion with a computer is advanced by digitization of radio communication. In accordance with the above, use of a resin material which has dielectric characteristics of both small dielectric loss and low specific dielectric constant has been gradually studied. As an example, prepreg in which a fluororesin having excellent dielectric characteristics is used, and a printed circuit board made of such prepreg have been developed and received attention.

In a conventional printed circuit board using a fluororesin, as glass cloth serving as a basic material of prepreg, glass composition filaments of E-glass cloth ($SiO_2$—$Al_2O_3$—$CaO$) are widely used because of excellent electrical insulation performance, high filament-forming properties, high workability, and a low price. However, such E-glass cloth has a specific dielectric constant of 6 to 7, and hence cannot sufficiently cope with low dielectric characteristics of a printed circuit board in which the speed-up of a calculation process is advancing. Moreover, E-glass cloth which is exclusively used in the conventional art has a mass of 50 g/m$^2$ or larger. E-glass cloth having a mass of 50 g/m$^2$ or larger is woven by a technique such as plain weave while using filament bundles in each of which about 200 glass filaments of several to about 10 microns are bundled, as warp and weft. As shown in a model diagram of FIG. 7, therefore, an increased number of glass filaments 21 inevitably increases the diameter D of a filament bundle 22 formed by bundling the filaments. Even when the filament bundle 22 of woven glass cloth is impregnated with an aqueous dispersion of a fluororesin, the resin cannot sufficiently penetrate into a center portion of the filament bundle 22, with the result that a resin-unimpregnated region 23 (the void region in FIG. 7 which is not hatched and which is surrounded by a circular broken line) is formed in the center portion. The resin-unimpregnated region 23 remains even after prepreg is produced, and even in the steps of processing a printed circuit board. In a chemical liquid immersing step which is one of the steps of processing a printed circuit board, therefore, the chemical liquid, metal ions, and the water content serving as an electrolyte easily impregnate or diffuse into a filament bundles passing through a through hole, via the resin-unimpregnated region 23. There is a possibility that this causes the electrical insulation resistance between through holes of the printed circuit board to be lowered and an insulation failure such as a short circuit occurs.

A printed circuit board for a high-frequency circuit is required to cope with a frequency band in the millimeter wave (30 to 300 GHz) region that is suitable to information transmission of a higher speed, and, on the other hand, also to have bendability and pliability (flexibility) which allows the printed circuit board to be used wound around a rod-like member serving as, for example, an antenna of a portable telephone or the like. In a printed circuit board of the conventional art using a fluororesin, however, E-glass cloth having a large mass and consisting of filament bundles in each of which a large number of or about 200 glass filaments are bundled is used as a basic material. Therefore, thinning and flexibility of a printed circuit board are impeded. A printed circuit board which has superior flexibility and is thin so as to be suitable for a high-frequency circuit has not yet been developed.

SUMMARY OF THE INVENTION

The present invention has been conducted in view of the above-mentioned background of the conventional art. It is an object of the present invention to provide a printed circuit board and prepreg for a printed circuit board which are excellent in dielectric characteristics, electrical insulation performance, and long-term reliability, which are thin and have superior flexibility, and which has many uses including a high-frequency circuit.

The printed circuit board of the present invention is a printed circuit board in which metal foil that forms a predetermined conductor pattern is placed on at least one face of a prepreg comprising: glass cloth serving as a basic material; and a fluororesin-impregnated layer in which a fluororesin is inpregnated and held into the glass cloth, and characterized in that the glass cloth has a mass of 30 g/m$^2$ or less, and a thickness of a whole is set to 0.2 mm or less.

According to the thus configured printed circuit board of the present invention, glass cloth of 30 g/m$^2$ or less is used as a basic material, and the thickness of the whole is set to 0.2 mm or less. Therefore, glass filaments constituting the glass cloth are small in number, and, as shown in a model diagram of FIG. 6, the diameter d and the section area of a filament bundle 22 formed by bundling glass filaments 21 can be reduced. According to this configuration, when the filament bundle 22 of woven glass cloth is impregnated with an aqueous dispersion of a fluororesin, the dispersion can sufficiently penetrate into a center portion of the filament bundle so that a resin-unimpregnated region is prevented from being formed in the center portion of the filament bundle. In a chemical liquid immersing step which is one of the steps of processing a printed circuit board, therefore, permeation and diffusion of the chemical liquid, metal ions, and the water content serving as an electrolyte, into the filament bundle can be blocked, and the electrical insulation resistance between through holes of the printed circuit board can be enhanced to attain remarkable improvements of electrical insulation performance and long-term reliability.

Since the mass of the glass cloth is reduced, moreover, the occupation ratio of the fluororesin of a lower specific dielectric constant in the prepreg of a constant size can be increased and the dielectric constant can be lowered by a degree corresponding to the increase. Therefore, it is possible to attain also an improvement of the dielectric characteristics.

Since the fluororesin can be uniformly impregnated into the glass cloth serving as the basic material, electrical insulation performance and dielectric characteristics can be prevented from being varied over the whole region of the prepreg and the printed circuit board, characteristics of the entire printed circuit board can be uniformalized, and the circuit board can be thinned.

In the glass cloth serving as the basic material in the printed circuit board of the present invention, preferably, glass composition filaments of E-glass cloth ($SiO_2$—$Al_2O_3$—$CaO$) are used. More preferably, the glass cloth has a mass of 24 g/m$^2$ or less. Furthermore, the glass cloth is preferably woven by filament bundles each of which is configured by 120 or less glass filaments.

Furthermore, in the printed circuit board of the present invention, a fluororesin-impregnated adhesive layer is preferably formed between the fluororesin-impregnated layer and the metal foil. The reasons for this will be described below.

When voids remain in the prepreg during steps of processing the printed circuit board, particularly the adhesiveness between the metal foil and the fluororesin-impregnated layer immediately below the metal foil is so poor that the peel strength is easily lowered. Atmospheric water, chemical liquid, or the like easily enters through the adhesive faces in which the peel strength is lowered. When the atmospheric water, chemical liquid, or the like permeates the remaining voids, there arises a problem in that a failure such as a short circuit of a circuit is secondarily caused. In a soldering step after such processing steps, gas or liquid which has entered voids may be suddenly expanded by the soldering temperature, thereby causing problems in that the portion is whitened to impair the appearance, and that breakage occurs in the circuit board.

When a fluororesin-impregnated adhesive layer is formed between the fluororesin-impregnated layer and the metal foil, the adhesiveness between the metal foil and the fluororesin-impregnated layer immediately below the metal foil is improved by the anchor effect due to the characteristics of the resin, and the peel strength can be enhanced. As a result, it is possible to obtain a printed circuit board in which the above-discussed secondary problem is solved and both the quality and the appearance are excellent.

As the fluororesin which is used in the printed circuit board of the invention, PTFE (tetrafluoroethylen resin), PFA (tetrafluoroethylene-phloroalkyl vinyl ether copolymer resin), FEP (tetrafluoroethylene-hexafluoropyran copolymer resin), or the like may be used. Among the resins, PTFE and PFA are preferably used from the viewpoints such as that the dielectric loss tangent is small, and that the melting point is so high that it does not melt during a soldering process. These fluororesins may be singly used, or combinedly used. In the case where a fluororesin-impregnated adhesive layer is formed between the fluororesin-impregnated layer and the metal foil, particularly, it is preferable to use PTFE as the fluororesin of the fluororesin-impregnated layer and PFA as that of the fluororesin-impregnated adhesive layer.

As the metal foil which is used in the printed circuit board of the invention, foil of a metal such as copper, aluminum, iron, stainless steel, nickel, or the like, or foil of an alloy of such metals may be used. Among the materials, copper foil is used most preferably.

The printed circuit board of the invention is not restricted to a circuit board in which a conductor pattern of metal foil is formed only on one face of the prepreg, and may be a circuit board in which a conductor pattern is formed on both the faces of the prepreg, or a circuit board of a multi-layer structure in which prepreg layers are stacked into, for example, four or eight layers on one face or both the faces, irrespective of the number of conductor patterns.

The prepreg for a printed circuit board of the invention is prepreg for a printed circuit board in which the prepreg comprises: glass cloth serving as a basic material; and a fluororesin-impregnated layer in which a fluororesin is impregnated and held into the glass cloth, and characterized in that the glass cloth has a mass of 30 g/m$^2$ or less, and a diameter of one glass filament is set to 4 to 8 μm.

According to the thus configured prepreg for a printed circuit board of the invention, glass cloth of 30 g/m$^2$ or less may be used as a basic material, and the diameter of one glass filament may be set to 4 to 8 μm, whereby the diameter and the section area of a filament bundle formed by bundling such glass filaments can be greatly reduced. As described above, an aqueous dispersion of a fluororesin sufficiently penetrates even into a center portion of the filament bundle. In a chemical liquid immersing step which is one of steps of processing a printed circuit board by using the prepreg, permeation and diffusion of the chemical liquid, metal ions, and the water content serving as an electrolyte, into the filament bundle are blocked. Prepreg in which remarkable improvements of electrical insulation performance and long-term reliability of a printed circuit board, and also an improvement of dielectric characteristics by increasing the occupation ratio of the fluororesin of a lower specific dielectric constant in prepreg of a constant size can be of course attained, and which are excellent in pliability and bendability is obtained. Thinning and flexibility of a printed circuit board which is produced by using such prepreg can be greatly improved. It is possible to produce a printed circuit board which can sufficiently cope with a use of being wound around a rod-like member that is used as, for example, an antenna of a portable telephone or the like, and which is applicable to any use such as a high-frequency circuit.

Also in the glass cloth serving as the basic material in the prepreg for a printed circuit board of the invention, preferably, glass composition filaments of E-glass cloth ($SiO_2$—$Al_2O_3$—$CaO$) are used. More preferably, the glass cloth has a mass of 24 g/m$^2$ or less. Furthermore, the glass cloth is preferably woven by filament bundles each of which is configured by 120 or less glass filaments.

DESCRIPTION OF THE PREFERRED EMBODIMENTS

Figure 1:
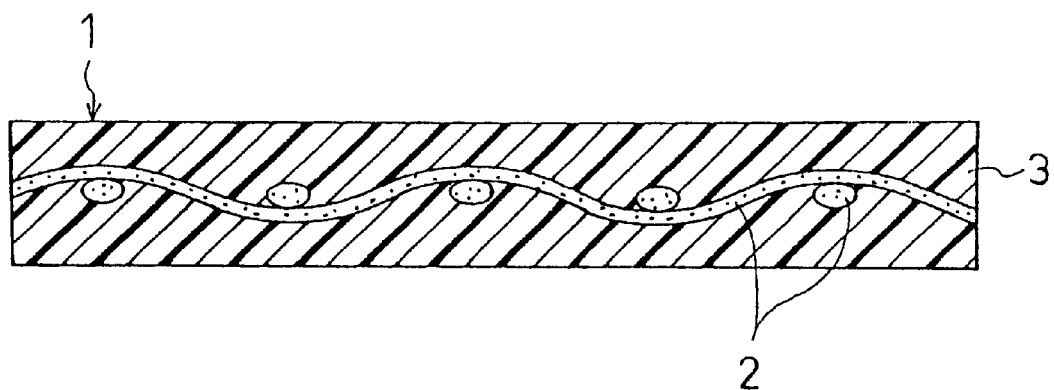
FIG. 1 is a longitudinal section view showing an example of the prepreg of the present invention.

FIG. 1 shows the sectional structure of an example of the prepreg for a printed circuit board of the present invention. The prepreg 1 is obtained by a production method in which E-glass cloth 2 serving as a basic material is immersed into and impregnated with an aqueous dispersion obtained by dissolving a fluororesin such as PTFE into a solvent (water), by the dipping method; the E-glass cloth is then pulled up, and dried at a temperature of the vicinity of 100° C. to be dehydrated; the E-glass cloth is thereafter dried again at a temperature where the fluororesin is not sintered, thereby forming a fluororesin-impregnated layer 3 in an unsintered state, on the E-glass cloth 2; and the above steps are repeated until the rate of resin impregnation of the fluororesin-impregnated layer 3 reaches a predetermined value.

In the specification, "unsintered state" includes both an unsintered resin state where the fluororesin has not yet undergone the sintering step, and a resin state where, although undergone the sintering step, the fluororesin has not yet been completely sintered.

Furthermore, "rate of resin impregnation" means the total amount of the fluororesin which is impregnated and attached to the E-glass cloth 2 serving as a basic material, and the fluororesin which is formed in a layered manner on the surface of the E-glass cloth 2. The rate of resin impregnation is adequately determined in accordance with the use or the like, and usually set to 50 to 96 vol %. When the rate is smaller than 50 vol %, the amount of the fluororesin which mainly contributes to adhesion is insufficient, and hence adhesiveness between sheets of prepreg may be sometimes lowered. When the rate is larger than 96 vol %, the mechanical strength of the obtained prepreg 1 is lowered, the dimensional stability of the prepreg 1 is impaired, and there is a possibility that mounting cannot be realized.

Figure 2:
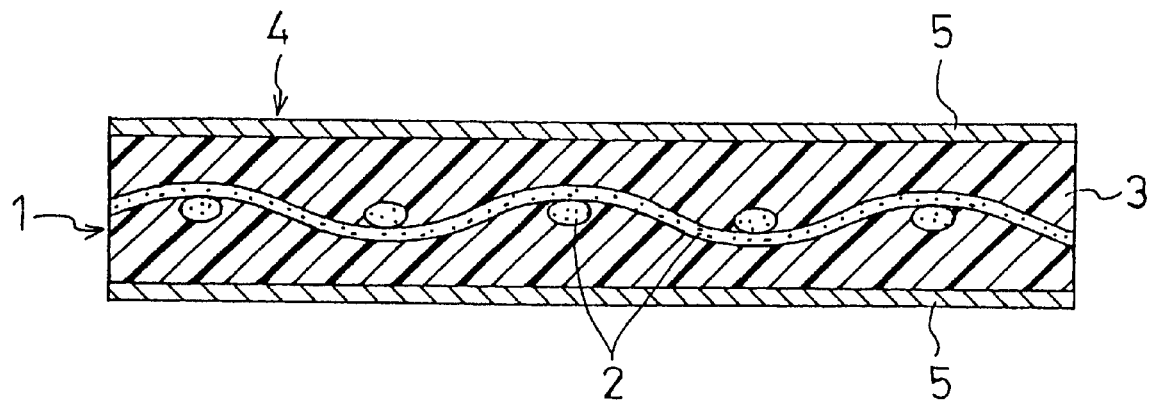
FIG. 2 is a longitudinal section view of a printed circuit board which is produced by using the prepreg of FIG. 1.

FIG. 2 shows the sectional structure of a layered member for a printed circuit board which is produced by using the thus produced prepreg. In the layered member, copper foils 5 and 5 are respectively placed on the faces of the prepreg 1 as an example of the metal foil, and pressure molding is then conducted to laminatedly integrate the two members 1, and 5 and 5 with each other.

Although the contact pressure of the pressure molding is slightly varied in accordance with the quality of the used 2 fluororesin, the pressure is usually 10 to 70 kgf/cm$^2$, and most preferably 20 to 50 kgf/cm$^2$. When the contact pressure is lower than 10 kgf/cm$^2$, there may be a case where minute voids existing in the prepreg 1 cannot be completely removed away. When the contact pressure is higher than 70 kgf/cm$^2$, there may be a case where a phenomenon such as that, during the molding process, the resin protrudes from the prepreg 1 occurs to adversely affect the dimensions. The time period of holding the maximum temperature is preferably about 30 to 80 minutes, and the molding time period is preferably about 4 to 6 hours.

Operations of opening holes and electroless plating are conducted on the thus produced layered member, and predetermined conductor patterns are then formed on the surfaces of the copper foils 5 and 5, thereby obtaining a double-sided printed circuit board 4.

In the formation of the conductor patterns, peel type dry film photoresist, solvent type dry film photoresist, or the like is used. An example will be described in detail. An alkali type dry film photoresist layer is formed on the surfaces of the copper foils 5 and 5, exposure is conducted in a predetermined pattern via photomasks thereon, unexposed portions of the photoresist are solved and removed away, the copper foils 5 and 5 are partly exposed, exposed portions of the copper foils 5 and 5 are then removed away by etching or the like, and exposed portions of the photoresist are solved and removed away, thereby forming conductor patterns corresponding to the exposed pattern of the photoresist.

Figure 3:
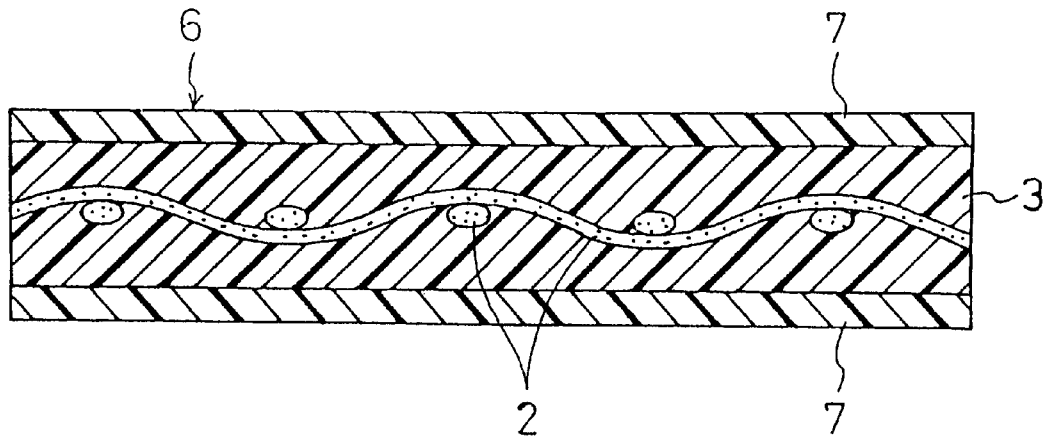
FIG. 3 is a longitudinal section view showing another example of the prepreg of the invention.

FIG. 3 shows the sectional structure of another example of the prepreg for a printed circuit board of the invention. In the same manner as the above-described prepreg of FIG. 1, the prepreg 6 is obtained by immersing and impregnating prepreg in which the fluororesin-impregnated layer 3 is formed in an unsintered state on the E-glass cloth 2 serving as a basic material, into an aqueous dispersion of a fluororesin such as PFA by the dipping method, to form fluororesin-impregnated adhesive layers 7 and 7 in an unsintered state on both the faces of the fluororesin-impregnated layer 3.

Figure 4:
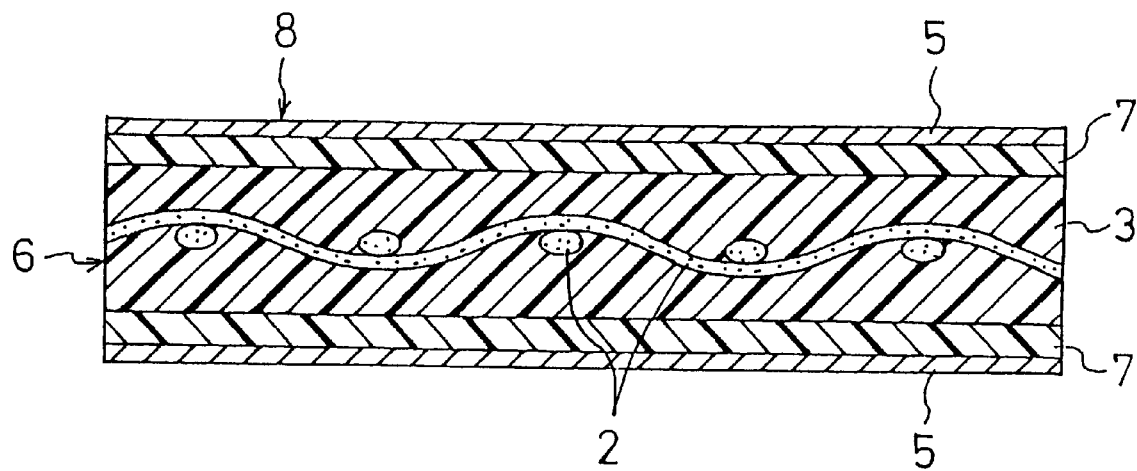
FIG. 4 is a longitudinal section view of a layered member for a printed circuit board which is produced by using the prepreg of FIG. 3.

FIG. 4 shows the sectional structure of a layered member for a printed circuit board which is produced by using the prepreg that is obtained as described above. In the layered member, copper foils 5 and 5 are respectively placed on the faces of the prepreg 6 as an example of the metal foil, and pressure molding is then conducted to laminatedly integrate the two members 1, and 5 and 5 with each other.

Operations of opening holes and electroless plating are conducted on the thus produced layered member, and predetermined conductor patterns are then formed on the surfaces of the copper foils 5 and 5 by using peel type dry film photoresist, solvent type dry film photoresist, or the like, thereby obtaining a double-sided printed circuit board 8.

Figure 5:
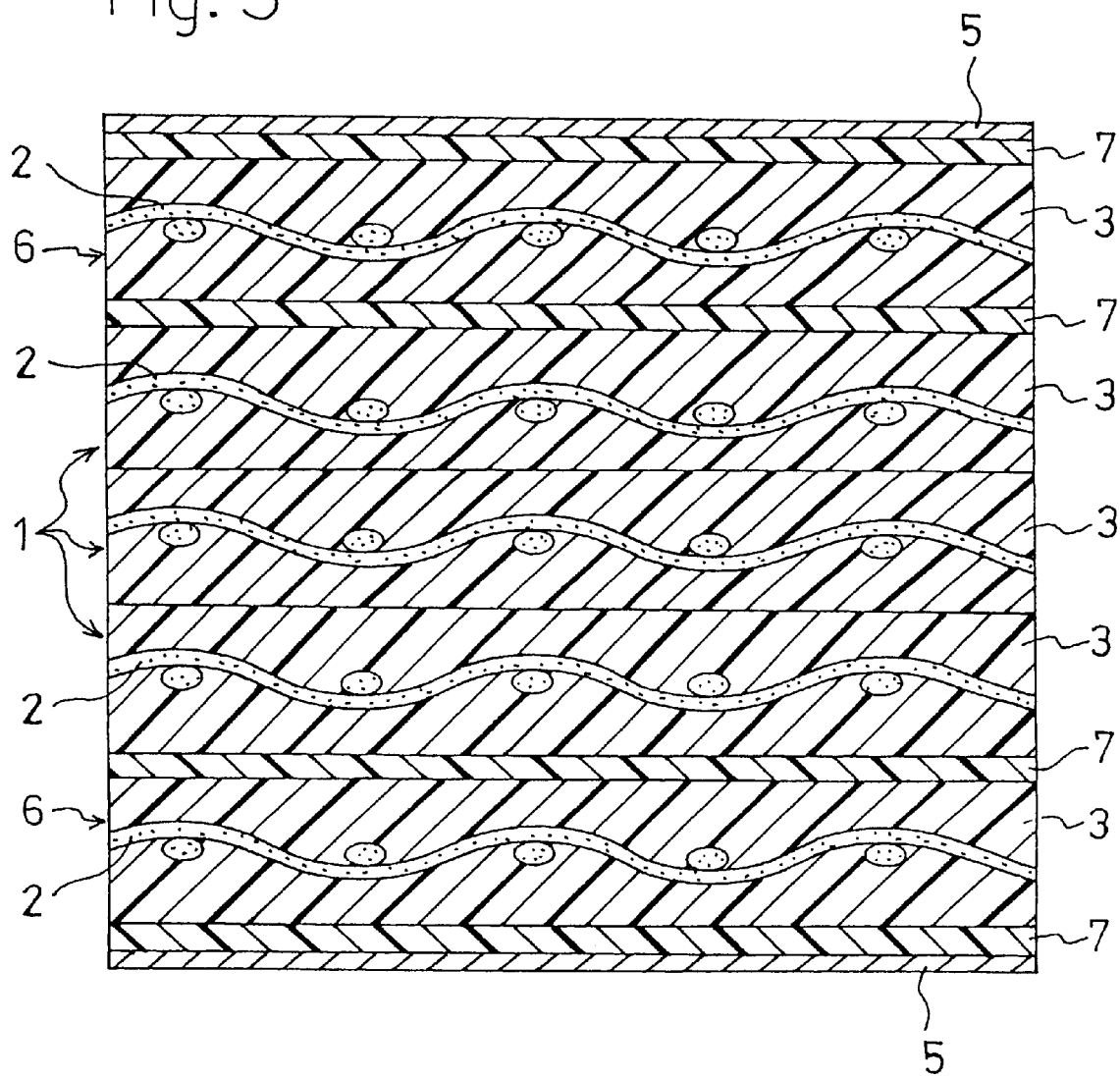
FIG. 5 is a longitudinal section view of a layered member for a printed circuit board which is produced by combinedly using the prepreg of FIG. 1 and that of FIG. 3.
Figure 6:
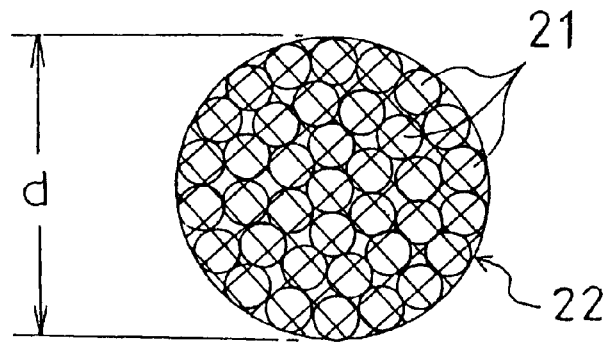
FIG. 6 is a model diagram illustrating a section of E-glass cloth serving as a basic material of the prepreg for a printed circuit board of the present invention, and an impregnated state of an aqueous dispersion of a fluororesin into a filament bundle.
Figure 7:
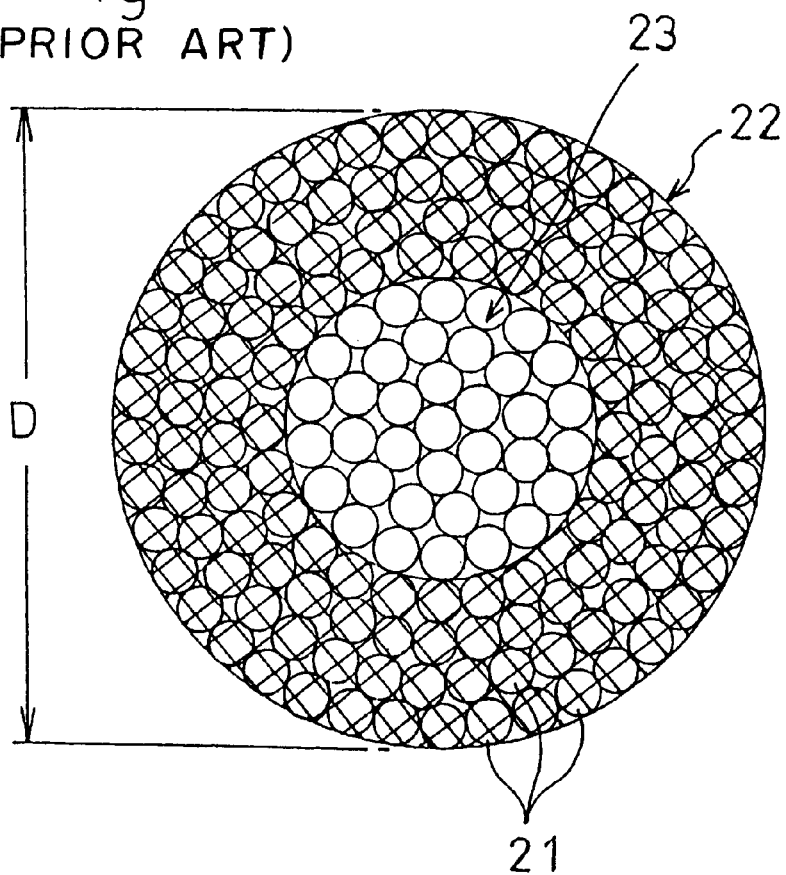
FIG. 7 is a model diagram illustrating a section of E-glass cloth serving as a basic material of the prepreg for a printed circuit board of the conventional art, and an impregnated state of an aqueous dispersion of a fluororesin into a filament bundle.

FIG. 5 shows the sectional structure of another example of the printed circuit board of the invention. The printed circuit board 9 is a printed circuit board of a multilayer structure which is configured by: stacking three sheets of prepreg 1 having the structure shown in FIG. 1; placing and stacking sheets of prepreg 6 having the structure shown in FIG. 3 on both the outer side faces of the stacked member, respectively; placing copper foils 5 and 5 on the outer side faces or the surfaces of the sheets of prepreg 6, respectively; and forming a predetermined conductor pattern on their surfaces.

As a printed circuit board of a multilayer structure, a circuit board in which three sheets of prepreg 1 and two sheets of prepreg 6 are stacked has been described with reference to FIG. 5. The number of stacked sheets of prepreg, and the stacking manner are not particularly restricted. However, the stacked structure which is mainly configured by the prepreg 1 having the structure shown in FIG. 1 is preferable from the viewpoint of the dielectric constant.

Next, experimental examples (embodiments) which have been conducted by the inventor of the invention will be described in detail.

Embodiment 1

PTFE having a mean particle diameter of 0.2 to 0.5 μm, a specific gravity of 2.13 to 2.22, and a specific dielectric constant of 2.1 is placed in a solvent (water) to obtain an aqueous dispersion. The aqueous dispersion is immersingly impregnated by the dipping method into E-glass cloth of a mass of 24 g/m² which is plain-woven by 60 warps and 50 wefts each consisting of a filament bundle having a thickness of 30 μm and 100 glass filaments, and to which a tension is applied by a pulling force of 0.1 to 0.3 kgf/cm. The E-glass cloth is then dried at about 100° C. to be dehydrated. Thereafter, a PTFE-impregnated layer in an unsintered state is formed on the E-glass cloth, thereby obtaining prepreg. Next, copper foil of a thickness of 18 μm is disposed on both the outer side faces of the obtained prepreg. Thereafter, sintering and pressure molding are conducted under conditions that the sintering temperature is 370° C. and the contact pressure is 20 kgf/cm², thereby obtaining a double-sided printed circuit board in which the thickness as a whole is 0.16 mm.

Embodiment 2

PTFE having a mean particle diameter of 0.2 to 0.5 μm, a specific gravity of 2.13 to 2.22, and a specific dielectric constant of 2.1 is placed in a solvent (water) to obtain an aqueous dispersion. The aqueous dispersion is immersingly impregnated by the dipping method into E-glass cloth of a mass of 24 g/m² which is plain-woven by 60 warps and 50 wefts each consisting of a filament bundle having a thickness of 30 μm and 100 glass filaments, and to which a tension is applied by a pulling force of 0.1 to 0.3 kgf/cm. The E-glass cloth is then dried at about 100° C. to be dehydrated. Thereafter, prepreg in which a PTFE-impregnated layer in an unsintered state is formed on the E-glass cloth is formed. Then, an aqueous dispersion of only PFA (having a melting point of 300 to 310° C.) having a specific gravity of 2.12 to 2.17 and a specific dielectric constant of 2.1 is immersingly impregnated by the dipping method into one face of the obtained prepreg. The prepreg is then dried at about 100° C. to be dehydrated, thereby obtaining prepreg in which a PFA-impregnated adhesive layer in an unsintered state is formed on the PTFE-impregnated layer. Next, copper foil of a thickness of 18 μm is disposed on both the outer side faces of the obtained prepreg. There after, sintering and pressure molding are conducted under conditions that the sintering temperature is 370° C. and the contact pressure is 20 kgf/cm², thereby obtaining a double sided printed circuit board in which the thickness as a whole is 0.16 mm.

COMPARATIVE EXAMPLE 1

A double-sided printed circuit board in which the thickness as a whole is 0.35 mm is obtained in the same specifications and production conditions as those of Embodiment 2 except that E-glass cloth which has a mass of 50 g/cm², and which is woven (plain-woven) by filament bundles of about 200 glass filaments is used.

COMPARATIVE EXAMPLE 2

Prepreg in which a polyimide-impregnated layer in an unsintered state is formed on E-glass cloth that has a mass of 50 g/cm², and that is woven (plain-woven) by filament bundles of about 200 glass filaments is formed, and prepreg in which an epoxy resin-impregnated adhesive layer is formed on one face of the formed prepreg is obtained. Next, copper foil of a thickness of 18 μm is disposed on both the outer side faces of the obtained prepreg. Thereafter, sintering and pressure molding are conducted under conditions that the sintering temperature is 210° C. and the contact pressure is 20 kgf/cm², thereby obtaining a double-sided printed circuit board in which the thickness as a whole is 0.15 mm.

COMPARATIVE EXAMPLE 3

Prepreg in which a PTFE-impregnated layer in an unsintered state is formed on E-glass cloth that has a mass of 48 g/cm², and that is woven (plain-woven) by filament bundles of about 200 glass filaments is formed, and prepreg in which a PFA-impregnated adhesive layer is formed on both the faces of the formed prepreg is obtained. Next, copper foil of a thickness of 18 μm is disposed on both the outer side faces of the obtained prepreg. Thereafter, sintering and pressure molding are conducted under conditions that the sintering temperature is 380° C. and the contact pressure is 20 kgf/cm², thereby obtaining a double-sided printed circuit board in which the thickness as a whole is 0.15 mm.

The specific dielectric constants, the dielectric loss tangents, the insulation resistances, and the flexibilities of the printed circuit boards which were obtained in the above-described embodiments and comparative examples were measured in accordance with the following measurement methods, and the results listed in Table 1 were obtained.

Measurement Methods

1. Specific Dielectric Constant and Dielectric Loss Tangent

The specific dielectric constants and the dielectric loss tangents of the printed circuit boards were measured in accordance with the test methods specified in JIS C 6481.

2. Insulation resistance

The insulation resistances of the printed circuit boards were measured in both (1) a normal state and (2) a case after boiling, in accordance with test method 5–11 specified in JIS C 6481.

The boiling process was conducted by placing test pieces in boiling distilled water and boiling the test pieces for two hours ±10 minutes. A test after boiling is a so-called accelerated test, relates to the life period, and therefore serves as an index of long-term reliability.

3. Flexibility (Pliability)

Pattern samples are prepared by cutting the printed circuit boards into dimensions of 45.7×25.4 mm. An aging test is conducted on each of the pattern samples, and a bendability test is then conducted by inserting the pattern sample into a tubular member of a diameter of 10 mm while winding the sample around the member. Then, the pattern sample is taken out from the tubular member, and visually evaluated, for example, whether a crack, a break, a white spot, or layer separation exists in the surface of the pattern sample or not. When a crack, a white spot, or the like does not exist, the sample is evaluated as O, and, when such a defect exists even in one place, the sample is evaluated as x.

TABLE 1

| | Specific dielectric constant (12 GHz) | Dielectric loss tangent (12 GHz) | Insulation resistance | | Pliability |
|---|---|---|---|---|---|
| | | | (normal) | (after boiling) | |
| Embodiment 1 | 2.2 | 0.0006 | $1.0 \times 10^{14}$ | $1.0 \times 10^{13}$ | O |
| Embodiment 2 | 2.2 | 0.0006 | $1.0 \times 10^{14}$ | $1.0 \times 10^{13}$ | O |
| Comparison example 1 | 2.6 | 0.0015 | $1.0 \times 10^{13}$ | $1.0 \times 10^{10}$ | X |
| Comparison example 2 | 4.5 | 0.007 | $1.0 \times 10^{13}$ | $1.0 \times 10^{8}$ | X |
| Comparison example 3 | 2.6 | 0.0015 | $1.0 \times 10^{13}$ | $1.0 \times 10^{11}$ | O |

As seen also from Table 1 above, in the printed circuit boards of Embodiments 1 and 2 corresponding to the invention, both the specific dielectric constant and the dielectric loss tangent are lower than those of Comparative examples 1 to 3, and hence the dielectric characteristics are superior. Also the insulation resistances in both the normal state and the state after-boiling state are so high that the electric conductivity between through holes is excellent, and its long-term reliability also is excellent. Furthermore, each of the printed circuit boards of Embodiments 1 and 2 is excellent in pliability, and, by using the excellent pliability together with the thinning, is enabled to sufficiently cope with usage such as that in which the printed circuit board is used with being wound around a rod-like member serving as, for example, an antenna of a portable telephone or the like. Therefore, the printed circuit boards are applicable to any use such as a high-frequency circuit.

As described above, in the printed circuit board of the invention, as E-glass cloth which serves as a basic material of prepreg, and into which a fluororesin-impregnated layer is to be impregnated and held, glass cloth which has a mass of 30 g/m$^2$ or less, and which is woven by filament bundles each consisting of 120 or less glass filaments is used, and the thickness of the whole is set to 0.2 mm or less. Therefore, the printed circuit board is excellent not only in dielectric characteristics, but also in electrical insulation resistance between through holes and its long-term reliability, and superior also in flexibility. Consequently, the printed circuit board is applicable to any use such as a high-frequency circuit.

In the claims:

1. A printed circuit board in which metal foil that forms a predetermined conductor pattern is placed on at least one face of prepreg comprising: glass cloth serving as a basic material; and a fluororesin-impregnated layer in which a fluororesin is impregnated and held into said glass cloth, wherein:

said fluororesin in the fluororesin-impregnated layer is PTFE; and said glass cloth has a mass of 24 g/m$^2$ or less, said glass cloth is woven by filament bundles each of which is configured by 120 or less glass filaments, and a thickness of a whole is set to 0.2 mm or less.

2. A printed circuit board according to claim 1, wherein said glass cloth is glass composition filaments of E-glass.

3. A printed circuit board according to claim 1, wherein a fluororesin-impregnated adhesive layer is formed between said fluororesin-impregnated layer and said metal foil.

4. A printed circuit board according to claim 3, wherein the fluororesin of said fluororesin-impregnated layer is PFA.

5. The printed circuit board according to claim 1, wherein a diameter of one glass filament is set to 4 to 8 $\mu$m.

6. Prepreg for a printed circuit board in which said prepreg comprises glass cloth serving as a basic material, and a fluororesin-impregnated layer in which a fluororesin is impregnated and held into said glass cloth, and a thickness of a whole of the printed circuit board being set to 0.2 mm or less, wherein:

said fluororesin in the fluororesin-impregnated layer is PTFE;

said glass cloth has a mass of 24 g/m$^2$ or less, said glass cloth is woven by filament bundles each of which is configured by 120 or less glass filaments, and a diameter of one glass filament is set to 4 to 8 $\mu$m.

7. Prepreg for a printed circuit board according to claim 6, wherein said glass cloth is glass composition filaments of E glass.

* * * * *